(12) United States Patent
Shima et al.

(10) Patent No.: US 9,242,554 B2
(45) Date of Patent: Jan. 26, 2016

(54) VEHICLE ROOF STRUCTURE

(71) Applicant: KABUSHIKI KAISHA TOYOTA JIDOSHOKKI, Kariya-shi, Aichi-ken (JP)

(72) Inventors: Yusuke Shima, Kariya (JP); Kazumasa Okumura, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 0 days.

(21) Appl. No.: 14/553,452

(22) Filed: Nov. 25, 2014

(65) Prior Publication Data

US 2015/0145290 A1 May 28, 2015

(30) Foreign Application Priority Data

Nov. 28, 2013 (JP) ................................ 2013-246419

(51) Int. Cl.
| | |
|---|---|
| *B60R 13/07* | (2006.01) |
| *B60K 16/00* | (2006.01) |
| *H02S 10/40* | (2014.01) |
| *B62D 25/06* | (2006.01) |
| *B62D 29/00* | (2006.01) |
| *B62D 29/04* | (2006.01) |
| *H01L 31/048* | (2014.01) |

(52) U.S. Cl.
CPC ............... *B60K 16/00* (2013.01); *B62D 25/06* (2013.01); *B62D 29/005* (2013.01); *B62D 29/043* (2013.01); *H01L 31/048* (2013.01); *H02S 10/40* (2014.12); *B60K 2016/003* (2013.01)

(58) Field of Classification Search
CPC .... Y02T 10/7083; Y02T 10/90; Y02B 10/20; Y02B 10/12; B60L 8/003; Y02E 10/50; H01L 31/048; H02S 20/23
USPC .......... 296/210, 211, 214, 215; 126/621, 623, 126/622; 136/244, 251, 291, 245, 246; 180/2.2; 320/101; 52/173.3; 454/900
See application file for complete search history.

(56) References Cited

U.S. PATENT DOCUMENTS

| | | | | |
|---|---|---|---|---|
| RE31,156 | E | * | 2/1983 | Dessert .......................... 180/2.2 |
| 6,034,320 | A | | 3/2000 | Malcherczyk et al. |
| 6,423,894 | B1 | * | 7/2002 | Patz et al. ....................... 136/244 |
| 6,682,132 | B1 | * | 1/2004 | Hahn ............................ 296/215 |
| 2002/0008410 | A1 | * | 1/2002 | Teschner et al. ............... 296/211 |

(Continued)

FOREIGN PATENT DOCUMENTS

| | | |
|---|---|---|
| DE | 4105396 A1 | 9/1992 |
| DE | 19716389 C1 | 9/1998 |

(Continued)

OTHER PUBLICATIONS

Communication dated Mar. 23, 2015, issued by the European Patent Office in counterpart Application No. 14194942.0.

*Primary Examiner* — Kiran B Patel

(74) *Attorney, Agent, or Firm* — Sughrue Mion, PLLC (57) ABSTRACT

A vehicle roof structure includes a solar cell unit having a plurality of solar cells arranged in a planar form at intervals from one another, a roof panel disposed to cover the solar cell unit from above, and a reinforcing member disposed under the solar cell unit. The reinforcing member supports the solar cell unit with a plurality of supporting parts provided at positions corresponding to the intervals left between the plurality of solar cells. The vehicle roof structure can prevent the solar cells from breaking down under stress.

10 Claims, 6 Drawing Sheets

(56) References Cited

U.S. PATENT DOCUMENTS

| | | | |
|---|---|---|---|
| 2002/0008411 A1* | 1/2002 | Patz et al. | 296/211 |
| 2002/0008412 A1* | 1/2002 | Patz et al. | 296/211 |
| 2004/0183342 A1* | 9/2004 | Paetz et al. | 296/216.09 |
| 2011/0226312 A1* | 9/2011 | Bohm et al. | 136/251 |
| 2012/0073885 A1* | 3/2012 | Glynn | 180/2.2 |
| 2013/0211976 A1* | 8/2013 | Breed | 705/28 |

FOREIGN PATENT DOCUMENTS

| | | |
|---|---|---|
| DE | 102009009242 A1 | 8/2010 |
| JP | 11-157342 A | 6/1999 |

* cited by examiner

VEHICLE ROOF STRUCTURE

This nonprovisional application is based on Japanese Patent Application No. 2013-246419 filed on Nov. 28, 2013 with the Japan Patent Office, the entire contents of which are hereby incorporated by reference.

BACKGROUND OF THE INVENTION

1. Field of the Invention

The present invention relates to a vehicle roof structure having solar cells.

2. Description of the Background Art

As disclosed in Japanese Patent Laying-Open No. 11-157342, a vehicle roof structure equipped with solar cells is known. The solar cells disclosed in the publication include a plurality of solar cells arranged in a planar form. The plurality of solar cells are sealed with resin on a glass panel. The roof structure including the plurality of solar cells sealed with resin on the glass panel are supported by reinforcing members with spacers interposed therebetween on the solar cells side.

SUMMARY OF THE INVENTION

Loads are imposed on the vehicle roof by snow coverage, car washing or the like. With a structure in which spacers, cushion members and the like are provided directly under solar cells to support a roof structure as described in Japanese Patent Laying-Open No. 11-157342, when a load is imposed on the roof, the load could be input to the solar cells through the spacer members or the like, so that the solar cells may break down. In this case, the solar cells can no longer generate electric power appropriately.

The present invention was made in view of the above actual circumstances, and has an object to provide a vehicle roof structure that can prevent solar cells from breaking down under stress.

A vehicle roof structure based on the present invention includes a solar cell unit having a plurality of solar cells arranged in a planar form at intervals from one another and a sealing resin sealing the plurality of solar cells, a roof panel having transparency and disposed to cover the solar cell unit from above, and a reinforcing member disposed under the solar cell unit. The reinforcing member supports the solar cell unit with a plurality of supporting parts provided at positions corresponding to the intervals left between the plurality of solar cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, an embodiment will be described with reference to the drawings. When the number, an amount or the like is mentioned, the scope of the present invention is not necessarily limited to that number, that amount or the like, unless otherwise specified. The same or corresponding parts have the same reference characters allotted, and detailed description thereof will not be repeated.

Figure 1:
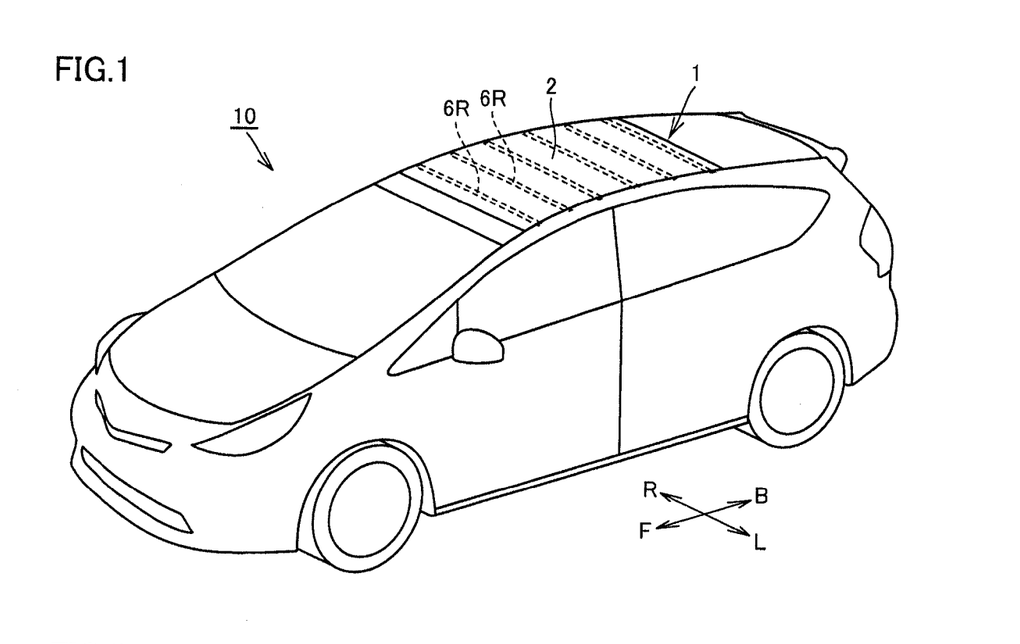
FIG. 1 is a perspective view showing a vehicle according to an embodiment.

FIG. 1 is a perspective view showing a vehicle 10 according to an embodiment. An arrow L in the drawing indicates the left direction of the vehicle, and an arrow R indicates the right direction of the vehicle. The direction along the arrows L and R is the width direction of the vehicle. An arrow F indicates the forward direction of the vehicle, and an arrow B indicates the backward direction of the vehicle. The direction along the arrows F and B is the longitudinal direction of the vehicle. These apply in common to FIGS. 2 to 5, 7 and 12 which will be described later.

Figure 2:
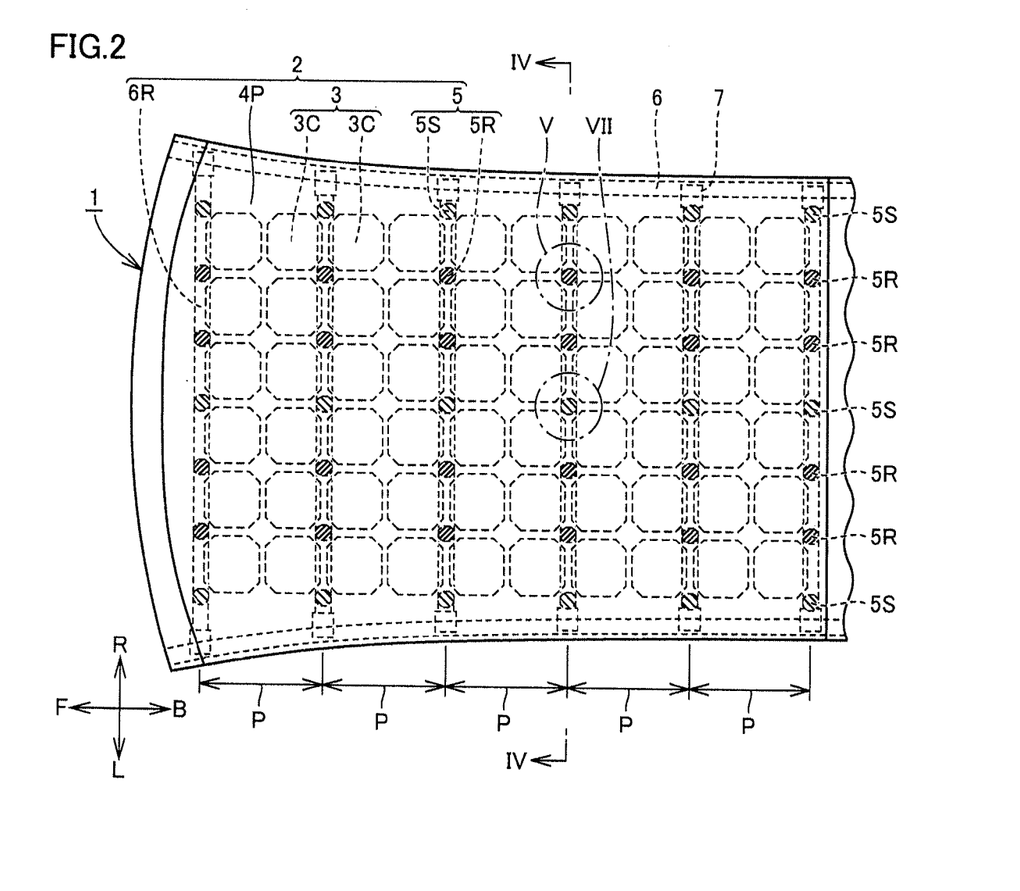
FIG. 2 is a partial plan view schematically showing a vehicle roof according to the embodiment.

As shown in FIG. 1, the vehicle 10 includes a vehicle roof structure 2 provided for a roof 1. FIG. 2 is a partial plan view schematically showing the roof 1 of the vehicle 10. As shown in FIG. 2, the roof 1 of the vehicle includes the vehicle roof structure 2 attached between roof side rails 6 arranged on the right and left.

Figure 3:
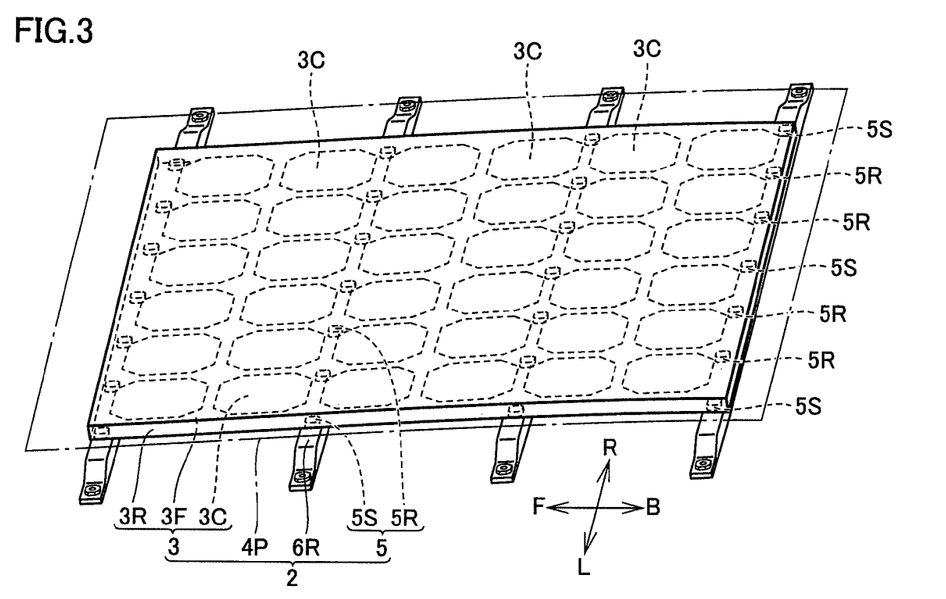
FIG. 3 is a perspective view schematically showing a vehicle roof structure provided for the vehicle according to the embodiment.
Figure 4:
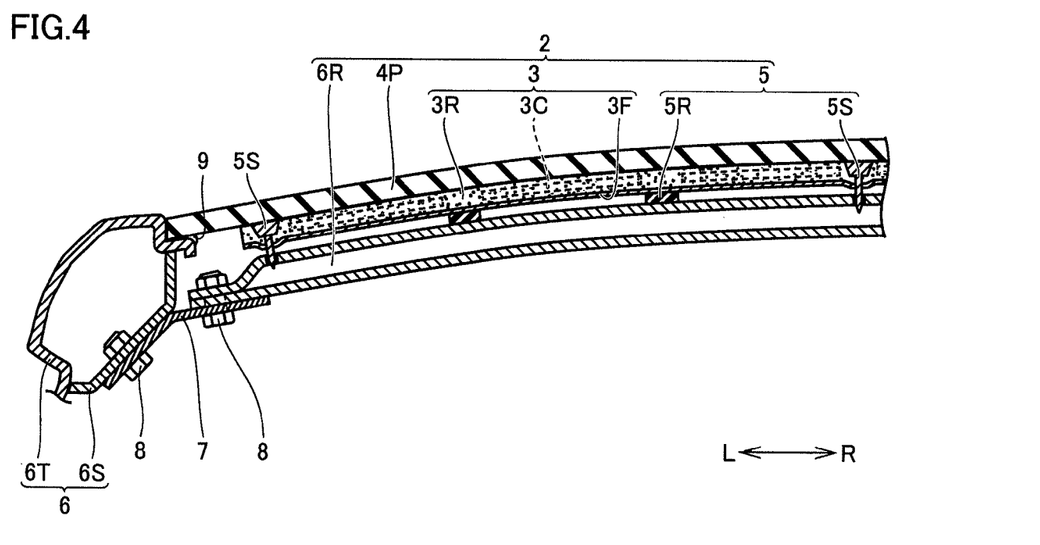
FIG. 4 is cross sectional view taken along the line IV-IV in FIG. 2.

FIG. 3 is a perspective view schematically showing the vehicle roof structure 2. FIG. 4 is a cross sectional view taken along the line Iv-Iv in FIG. 2. As shown in FIGS. 2 to 4, the vehicle roof structure 2 includes a solar cell unit 3, a roof panel 4P, a plurality of reinforcements 6R (reinforcing members), and a plurality of supporting parts 5. The solar cell unit 3 includes a plurality of solar cells 3C, transparent resin 3R as a sealing resin (FIGS. 3 and 4), and a film 3F (FIGS. 3 and 4) provided on the lower surface side of the transparent resin 3R.

The plurality of solar cells 3C are arranged in a planar form at intervals from one another, and are connected to one another in series and in parallel to constitute a battery. In the present embodiment, each of the solar cells 3C has a generally octagonal shape with four corners of a rectangular panel slightly cut away in a plan view. The plurality of solar cells 3C are arranged in a matrix form such that cutaway parts of adjacent cells are adjacent to each other. Each of the solar cells 3C includes a silicon-based crystal, and has characteristics of easily breaking down in the case of receiving an excessive bending load. The size, shape and number of the solar cells 3C included in the solar cell unit 3, as well as the interval between the solar cells 3C adjacent to each other are configured such that the mounting density of the solar cells 3C is as large as possible in the roof panel 4P of the vehicle roof structure 2. That is, the solar cells 3C may have a quadrangular shape, such as a square or a rectangle, or the solar cells 3C may have a disc shape. It is noted that, as for the interval between the solar cells 3C adjacent to each other, its minimum required distance is set in accordance with various conditions, such as the wiring space of the solar cells 3C and a heat shrinkage absorption margin of the sealing resin.

The transparent resin 3R as the sealing resin covers internal members within a module, such as the solar cells 3C which are power generation elements and wiring lines, to protect the internal members from permeation of water content and impacts. As the transparent resin 3R, a publicly known sealing resin material, such as EVA (ethylene acetic acid copolymer), PVB (polyvinyl butyral) or a silicone resin, is used. The transparent resin 3R seals the plurality of solar cells 3C, so that the plurality of solar cells 3C are adhered to the lower surface of the roof panel 4P (see FIG. 4). The film 3F is provided on the transparent resin 3R on the opposite side of the roof panel 4P. The roof panel 4P, the transparent resin 3R including the solar cells 3C, and the film 3F constitute an integrated unit.

The roof panel 4P is a member constituting part of the upper surface of the roof 1 of the vehicle 10, and has a plate-like shape. In FIG. 3, the roof panel 4P is schematically indicated by an alternate long and short dash line for the sake of convenience. The upper surface of the roof panel 4P constitutes the outer surface of the vehicle, and is exposed to the outside air. The roof panel 4P covers the solar cell unit 3 from above by its lower surface. In the present embodiment, a resin panel having transparency is used as the roof panel 4P. Examples of a resin material constituting the roof panel 4P include a polycarbonate resin, an acrylic resin, a PET resin, and a vinyl chloride resin, which are appropriately selected in accordance with a use environment. Sunlight passes through the roof panel 4P to reach each of the solar cells 3C in the solar cell unit 3. A hard coating or the like is applied to the outer surface of the roof panel 4P made of a resin to increase damage resistance. Although the roof panel 4P may be implemented by a glass panel, a resin panel when used for the roof panel 4P can advantageously make the total weight of the roof lighter than in the case of using the glass panel.

The following method can be adopted, for example, in order to bond the plurality of solar cells 3C to the lower surface of the roof panel 4P (the surface opposite to the outer surface of the vehicle). First, the lower surface of the roof panel 4P is placed upward, and a sheet material is disposed on the roof panel 4P. This sheet material is a member made of thermoplastic resin having transparency (e.g., EVA), and constitutes the sealing resin. Next, the plurality of solar cells 3C are arranged in a planar form on the sheet material. Another sheet material is disposed to cover the plurality of solar cells 3C. This sheet material is also a member made of thermoplastic resin having transparency (e.g., EVA), and constitutes the sealing resin. Then, the film 3F is disposed to cover that sheet material.

Next, the above two sheet materials are subjected to vacuum heating between the film 3F and the roof panel 4P. The two sheet materials are melted. By stopping vacuum heating, the two sheet materials solidify to form the transparent resin as the sealing resin (see the sealing resin 3R in FIG. 4). The plurality of solar cells 3C are sealed with the sealing resin and adhered to the roof panel 4P.

The reinforcements 6R as the reinforcing members each have a shape extending in the form of rod, and are disposed below the solar cell unit 3. The reinforcements 6R support the solar cell unit 3 from below (from the vehicle cabin side) with the plurality of supporting parts 5 (cushion rubbers 5R) which will be described next. The reinforcements 6R are each implemented by a member of metal, such as iron, and have a shape of rectangular tube (see FIG. 3). The reinforcements 6R each extend in the vehicle width direction, and are arranged in parallel at intervals P (FIG. 2) from one another in the vehicle longitudinal direction. The interval P is 300 mm, for example.

The plurality of supporting parts 5 include a plurality of cushion rubbers 5R (see also FIG. 6) and a plurality of positioning parts 5S (see also FIG. 8), which are provided between the transparent resin 3R (more specifically, the film 3F) of the solar cell unit 3 and the reinforcements 6R. Hereinafter, the shape and arrangement of the cushion rubbers 5R and the positioning parts 5S will be described.

(Cushion Rubber 5R)

Figure 5:
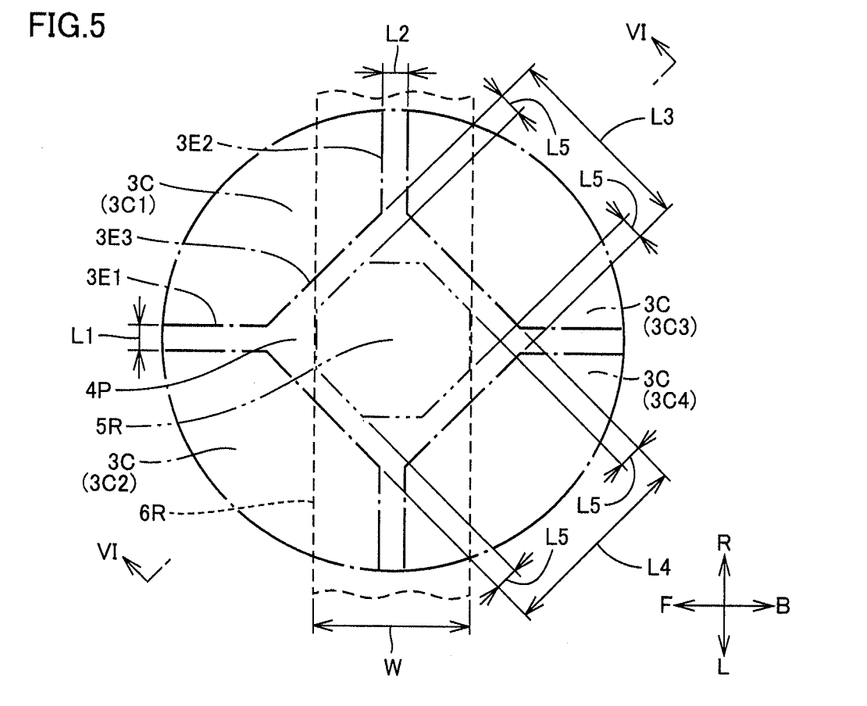
FIG. 5 is an enlarged view showing a region encircled with the line V in FIG. 2.
Figure 6:
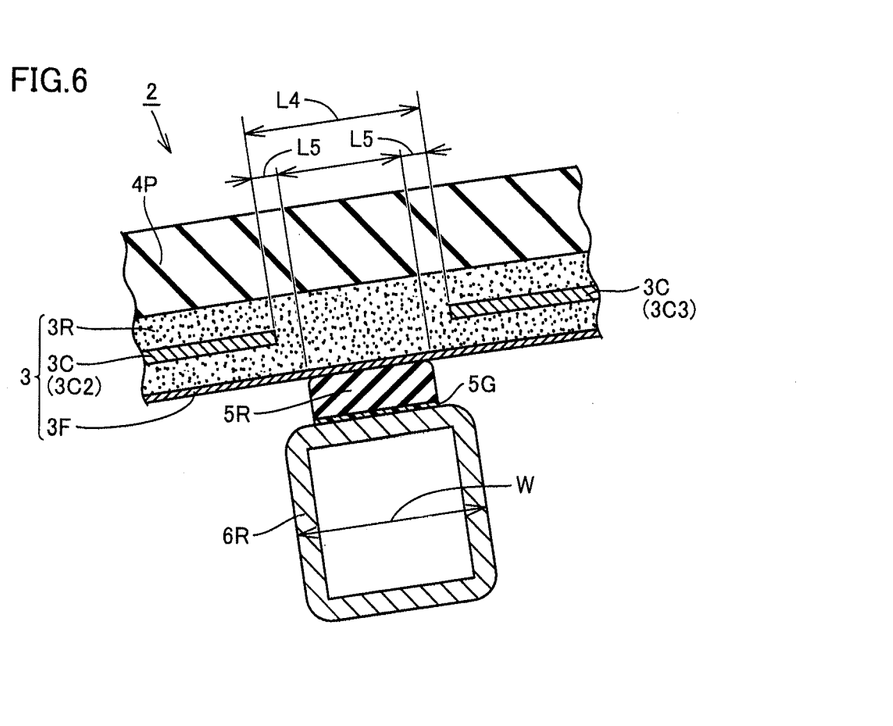
FIG. 6 is a cross sectional view taken along the line VI-VI in FIG. 5.

FIG. 5 is an enlarged view showing a region encircled with the line V in FIG. 2. FIG. 5 illustrates four of the plurality of solar cells 3C (3C1 to 3C4) arranged in two rows and two columns, the reinforcement 6R having a width W and extending in the vehicle width direction, the roof panel 4P provided to cover the solar cell unit 3 (see FIG. 4), and the cushion rubbers 5R provided between the solar cell unit 3 and the reinforcements 6R. FIG. 6 is a cross sectional view taken along the line VI-VI in FIG. 5.

Referring to FIGS. 5 and 6, as described above, each of the plurality of solar cells 3C has a generally octagonal shape in a plan view, and are arranged in a planar form at intervals from one another. Each of the plurality of solar cells 3C has an outer edge 3E1 extending in the vehicle longitudinal direction, an outer edge 3E2 extending in the vehicle width direction, and an outer edge 3E3 formed between the outer edge 3E1 and the outer edge 3E2 and extending in an oblique direction.

The two solar cells 3C1 and 3C2 are adjacent to each other in the vehicle width direction. An interval L1 is left between the outer edges 3E1 of the solar cells 3C1 and 3C2. The two solar cells 3C3 and 3C4 are also adjacent to each other in the vehicle width direction. The interval L1 is also left between the outer edges 3E1 of the solar cells 3C3 and 3C4.

The two solar cells 3C1 and 3C3 are adjacent to each other in the vehicle longitudinal direction. An interval L2 is left between the outer edges 3E2 of the solar cells 3C1 and 3C3. The two solar cells 3C2 and 3C4 are also adjacent to each other in the vehicle longitudinal direction. The interval L2 is also left between the outer edges 3E2 of the solar cells 3C2 and 3C4.

The two solar cells 3C1 and 3C4 are adjacent to each other in an oblique direction. An interval L3 is left between the outer edges 3E3 of the solar cells 3C1 and 3C4. The two solar cells 3C2 and 3C3 are also adjacent to each other in an oblique direction. An interval L4 is left between the outer edges 3E3 of the solar cells 3C2 and 3C3. That is, the plurality of solar cells 3C disposed in a matrix form are arranged such that the cutaway parts of adjacent cells are adjacent to each other, and therefore, relatively large clearances are left between the above-mentioned four solar cells 3C1, 3C2, 3C3, and 3C4 by means of the cutaway parts.

The intervals L1 and L2 have a dimension of 3 mm to 5 mm, for example. This value is optimized in view of the wiring operation of connecting the solar cells together, the degree of heat shrinkage of the transparent resin 3R when solidifying a transparent thermoplastic resin such as EVA by means of the film 3F, the overall layout of the plurality of solar cells, and the like. The dimension of the intervals L3 and L4 is determined in accordance with, for example, the size of the solar cells, manufacturing steps of the solar cells, and the like.

In the present embodiment, the cushion rubber 5R has a generally octagonal shape in a plan view, and is provided between the transparent resin 3R (the film 3F) of the solar cell unit 3 and the reinforcement 6R. The cushion rubber 5R is provided separately from the solar cell unit 3 (the transparent resin 3R). As shown in FIG. 6, an adhesive 5G is preferably provided between the cushion rubber 5R and the reinforcement 6R. The cushion rubber 5R is provided at a position corresponding to the intervals L3 and L4 left between the solar cells 3C1 to 3C4.

In other words, defining a region formed by the intervals L3 and L4 (a region where no solar cell is provided) as a clearance region, the cushion rubber 5R is provided at a position corresponding to this clearance region. In a plan view, the cushion rubber 5R has an area smaller than that of this clearance region. When the cushion rubber 5R (the upper surface of the cushion rubber 5R) is projected onto the clearance region and the reinforcement 6R, the projected image of the cushion rubber 5R (the upper surface of the cushion rubber 5R) is entirely included in the projected image of the clearance region and the reinforcement 6R.

In a plan view, a distance L5 (FIG. 5) between the outer edge the cushion rubber 5R and the outer edge 3E3 of the solar cell 3C is 3 mm to 5 mm, for example. The cushion rubber 5R is configured and arranged as described above. The reinforcement 6R supports the solar cell unit 3 through the cushion rubber 5R interposed therebetween.

(Positioning Part 5S)

Figure 7:
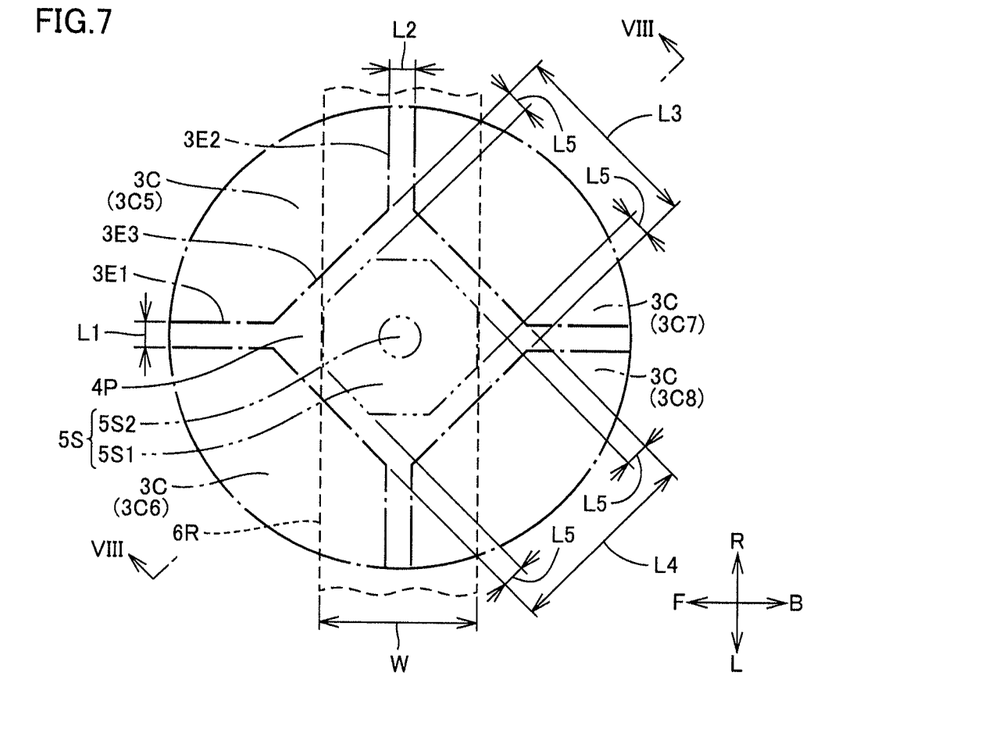
FIG. 7 an enlarged view showing a region encircled with the line VII in FIG. 2.
Figure 8:
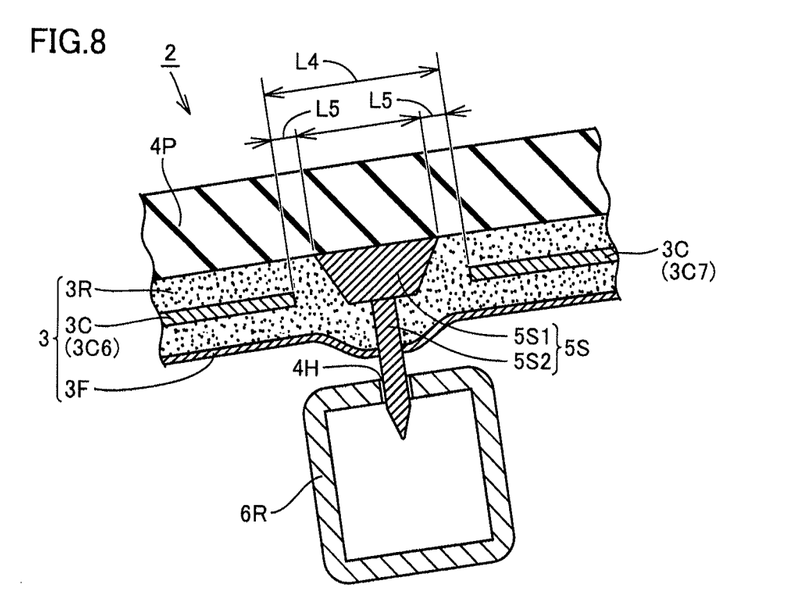
FIG. 8 is a cross sectional view taken along the line VIII-VIII in FIG. 7.

FIG. 7 an enlarged view showing a region encircled with the line VII in FIG. 2. FIG. 7 illustrates four of the plurality of solar cells 3C (3C5 to 3C8) arranged in two rows and two columns, the reinforcement 6R, the roof panel 4P, and a positioning part 5S. The positioning part 5S has a portion (a boss 5S2) protruding from the solar cell unit 3 toward the reinforcement 6R. FIG. 8 is a cross sectional view taken along the line VIII-VIII in FIG. 7.

The interval L1 is left between the outer edges 3E1 of the solar cells 3C5 and 3C6 adjacent to each other in the vehicle width direction. The interval L1 is also left between the outer edges 3E1 of the solar cells 3C7 and 3C8. The interval L2 is left between the outer edges 3E2 of the solar cells 3C5 and 3C7 adjacent to each other in the vehicle longitudinal direction. The interval L2 is also left between the outer edges 3E2 of the solar cells 3C6 and 3C8. The interval L3 is left between the outer edges 3E3 of the solar cells 3C5 and 3C8 adjacent to each other in an oblique direction. The interval L4 is left between the outer edges 3E3 of the solar cells 3C6 and 3C7 adjacent to each other in an oblique direction.

The positioning part 5S includes a boss seat 5S1 and the boss 5S2 (projection). The boss seat 5S1 and the boss 5S2 are made of polycarbonate, for example. The boss seat 5S1 has a generally octagonal shape in a plan view. The positioning part 5S is fixed to the roof panel 4P. The positioning part 5S is preferably integrated with the roof panel 4P by a double molding method or the like. The boss 5S2 has a shape extending in the form of rod from the solar cell unit 3 toward the reinforcement 6R. The reinforcement 6R has a circular opening 4H formed therein, and the size and shape of the opening 4H are set such that the boss 5S2 can be inserted into the opening 4H.

The positioning part 5S is provided at a position corresponding to the intervals L3 and L4 left between the solar cells 3C5 to 3C8. Defining a region formed by the intervals L3 and L4 (a region where no solar cell is provided) as a clearance region, the positioning part 5S has an area smaller than that of this clearance region in a plan view. When the positioning part 5S is projected onto the clearance region and the reinforcement 6R, the projected image of the positioning part 5S is entirely included in the projected image of the clearance region.

In a plan view, the distance L5 (FIG. 7) between the outer edge the positioning part 5S (the boss seat 5S1) and the outer edge 3E3 of the solar cell 3C is 3 mm to 5 mm, for example. The reinforcement 6R is positioned by inserting the positioning part 5S into an opening 3H.

Referring again to FIGS. 2 and 3, when seeing at one reinforcement 6R, the plurality of positioning parts 5S configured as described above are provided one each at the center and the both ends in the vehicle width direction, and the plurality of cushion rubbers 5R are provided therebetween. For the sake of description, the positioning parts 5S and the cushion rubbers 5R shown in FIG. 2 are indicated by two different types of hatchings (upward sloping and downward sloping), respectively, for distinction between them. The positioning parts 5S provided one each at the center and the both ends in the vehicle width direction can fulfill a high positioning function, and the plurality of cushion rubbers 5R offer high damping performance and shock-absorbing characteristics.

(Fixing Structure)

Referring again to FIGS. 2 and 4, a bracket 7 and fasteners 8 are used in order to fix the solar cell unit 3, the roof panel 4P and the reinforcements 6R to roof side rails 6 of the vehicle 10 (FIG. 1). The roof side rails 6 each include a side member outer panel 6T and a rail inner panel 6S, and extend in the vehicle longitudinal direction at the both side edges in the vehicle width direction.

One end of the bracket 7 closer to the roof side rail 6 is fixed to the rail inner panel 6S with the fastener 8, and the other end of the bracket 7 closer to the reinforcement 6R is fixed to the reinforcement 6R with another fastener 8. The reinforcement 6R is supported in a bridging manner at the both ends thereof by the roof side rails 6 on the left and right sides, with the bracket 7 on the left side of the vehicle and the bracket 7 (not shown) on the right side of the vehicle interposed therebetween, respectively. It is noted that the brackets 7 are not necessarily provided, but the reinforcements 6R may be attached directly to the roof side rails 6.

The reinforcement 6R and the bracket 7 are secured with the fastener 8 to constitute a unit. As for the roof panel 4P and the roof side rails 6, the clearance left between the periphery of the vehicle inner-side end of the roof panel 4P and each of the roof side rails 6 is filled with a urethane-based adhesive 9 (FIG. 4). Then, the unit of the reinforcement 6R and the bracket 7 is positioned utilizing the above-described positioning part 5S (FIG. 8) to be attached to the solar cell unit 3 and the roof panel 4P. The unit of the reinforcement 6R and the bracket 7 is then fixed to the roof side rail 6 with the fastener 8.

(Functions and Effects)

As described at the beginning, loads are imposed on the vehicle roof by snow coverage, car washing or the like. Let it be supposed that the supporting parts 5 including the cushion rubbers 5R and the positioning parts 5S are provided at positions overlapping the solar cells 3C in a plan view. In this case, when a load is imposed on the vehicle roof, the solar cells 3C will suffer from stress resulting from the load. The solar cells may break down so that they can no longer generate electric power appropriately.

Figure 9:
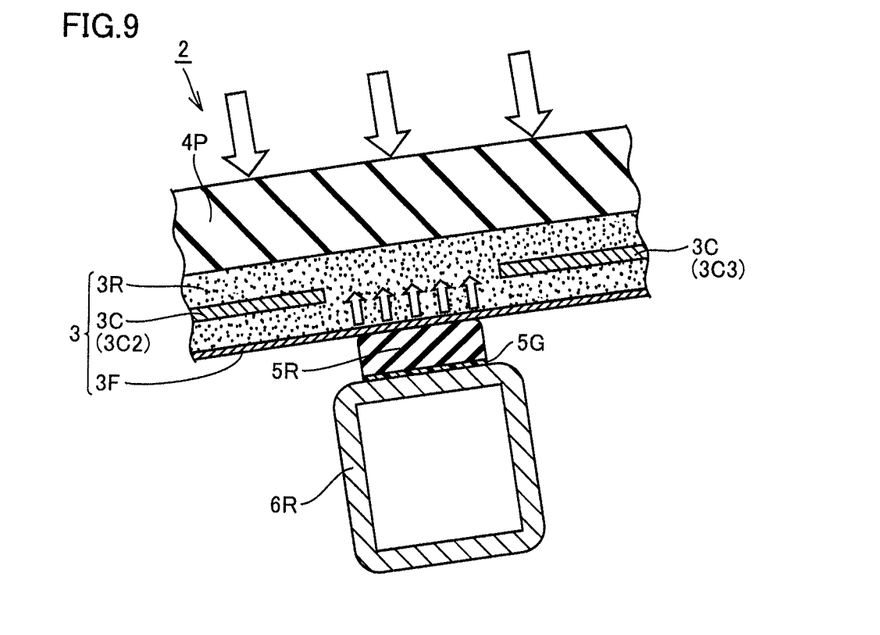
FIG. 9 is a cross sectional view showing a state when the vehicle roof structure provided for the vehicle according to the embodiment is put under a load.

In contrast, referring to FIG. 9, in the present embodiment, the cushion rubber 5R is provided at a position corresponding to the intervals left between the solar cells 3C adjacent to each other. Even when a load is imposed on the vehicle roof, stress resulting from the load will be mainly imposed on the transparent resin 3R (where none of the solar cells 3C is provided) positioned between the solar cells 3C adjacent to each other. Stress is effectively prevented from being imposed on the solar cells, which can achieve a structure in which the solar cells 3C are unlikely to break down. It may be configured such that the mounting density of the solar cells 3C is as large as possible by utilizing the clearances left between the solar cells 3C as described above.

In the present embodiment, the roof panel 4P made of resin is used. The use of the roof panel 4P made of resin rather than a glass plate can provide an advantage in reducing the weight of the roof 1, however, the reinforcements 6R having a predetermined width are used as reinforcing members since the roof panel 4P made of resin has rigidity lower than that of a glass plate. On the other hand, the solar cells are arranged in a planar form such that the interval between the solar cells adjacent to each other is smaller in general in order to increase the mounting density thereof. Therefore, the width of the reinforcements 6R may be larger than the interval between the solar cells 3C adjacent to each other depending on the strength required of the reinforcements 6R and the interval between adjacent solar cells.

When the width of the reinforcements 6R is larger than the interval between the solar cells 3C adjacent to each other, and assuming that the solar cell unit 3 is directly supported by the reinforcements 6R without providing the cushion rubbers 5R, ends of the cells will interfere with the reinforcements 6R in the cross sectional vertical direction. Then, the cells may receive excess stress and break down. Herein, when cutting up cells (single crystal cells) from a typical cylindrical ingot to form the solar cells 3C, the solar cells 3C can have an octagonal shape with the corners of a rectangular shape removed. With the four corners provided for the solar cells 3C, relatively large clearances are left between the plurality of solar cells 3C when arranged in a matrix form. In the present embodiment, these clearances are utilized positively to arrange the cushion rubbers 5R and the positioning parts 5S. Therefore, the present embodiment can achieve a structure in which stress can effectively be prevented from being imposed on the solar cells 3C, and in addition, the clearances are effectively utilized, and in turn, the mounting density of the solar cells 3C can effectively be improved.

In the present embodiment, the positioning part 5S (FIG. 8) is also provided at a position corresponding to the intervals left between the solar cells 3C adjacent to each other. When the positioning part 5S is fixed to the reinforcement 6R, a similar phenomenon may take place as in the case described with reference to FIG. 9. That is, even when a load is imposed on the vehicle roof, stress resulting from the load will be mainly imposed on the transparent resin 3R (where none of the solar cells 3C is provided) positioned between the solar cells 3C adjacent to each other. A structure can be achieved in which stress is effectively prevented from being imposed on the solar cells 3C from the positioning part 5S, so that the solar cells are unlikely to break down.

Figure 10:
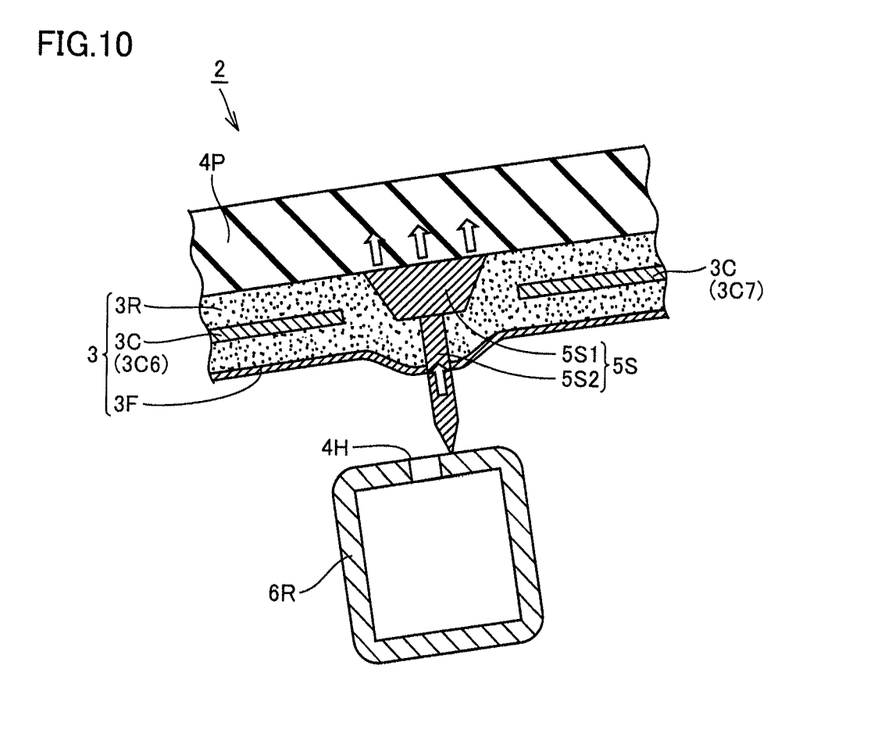
FIG. 10 is another cross sectional view showing a state when the vehicle roof structure provided for the vehicle according to the embodiment is put under a load.

Referring to FIG. 10, when assembling the reinforcement 6R to the solar cell unit 3, it is assumed that the boss 5S2 is not successfully inserted into the opening 4H, but the lower end of the boss 5S2 is brought into contact with the surface of the reinforcement 6R. A structure can be achieved in which, even in such a case, stress is effectively prevented from being imposed on the solar cells 3C, so that the solar cells are unlikely to break down.

In the present embodiment, it is possible to achieve predetermined rigidity and also achieve weight reduction by the roof panel 4P made of a transparent resin and the plurality of reinforcements 6R. The overall weight can be made lighter by adopting the reinforcements 6R to increase rigidity without making the thickness of the roof panel 4P very thick, than when increasing the thickness of the roof panel 4P to increase rigidity. The overall weight can be made lighter even in consideration of the additional weight of the reinforcements 6R than in the case of using a glass panel.

As described above, the solar cells 3C of the present embodiment are sealed with a transparent thermoplastic resin, such as EVA (Ethylene Vinyl Acetate). By the method of sealing with EVA, a process step takes a shorter time than in the method of enclosing solar cells in FRP, so that productivity can be improved.

[First Variation]

Figure 11:
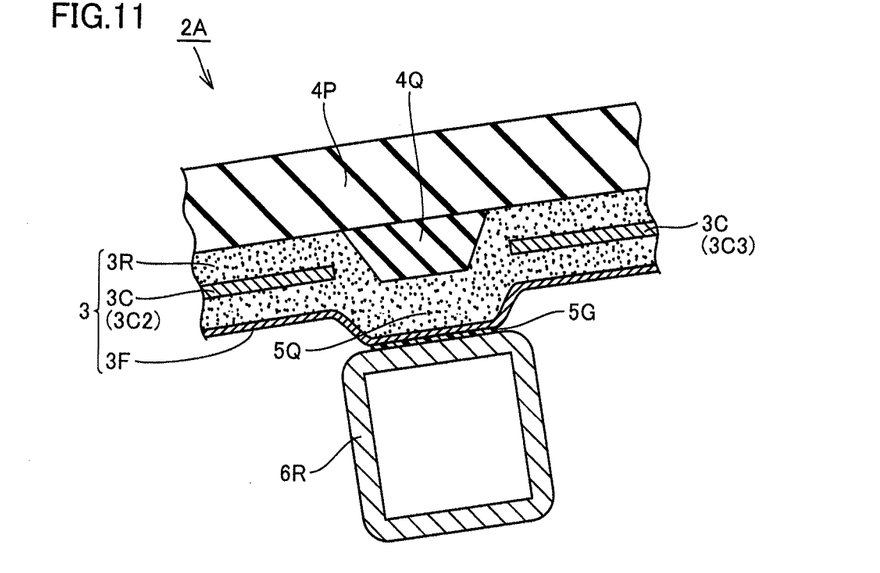
FIG. 11 is a cross sectional view showing a vehicle roof structure according to a first variation of the embodiment.

As a vehicle roof structure 2A shown in FIG. 11, the supporting part may include a raised part 5Q. The raised part 5Q can be used instead of the cushion rubber. The raised part 5Q is formed by solidifying the transparent resin 3R with a projecting part 4Q previously provided on the lower surface of the roof panel 4P. The raised part 5Q is a section integrally formed with the solar cell unit 3, and is shaped such that part of the transparent resin 3R sealing the solar cells 3C is raised toward the reinforcement 6R. The reinforcement 6R supports the solar cell unit 3 sealed with the transparent resin 3R with the raised part 5Q interposed therebetween. With this structure, functions and effects similar to those described above can also be obtained.

[Second Variation]

Figure 12:
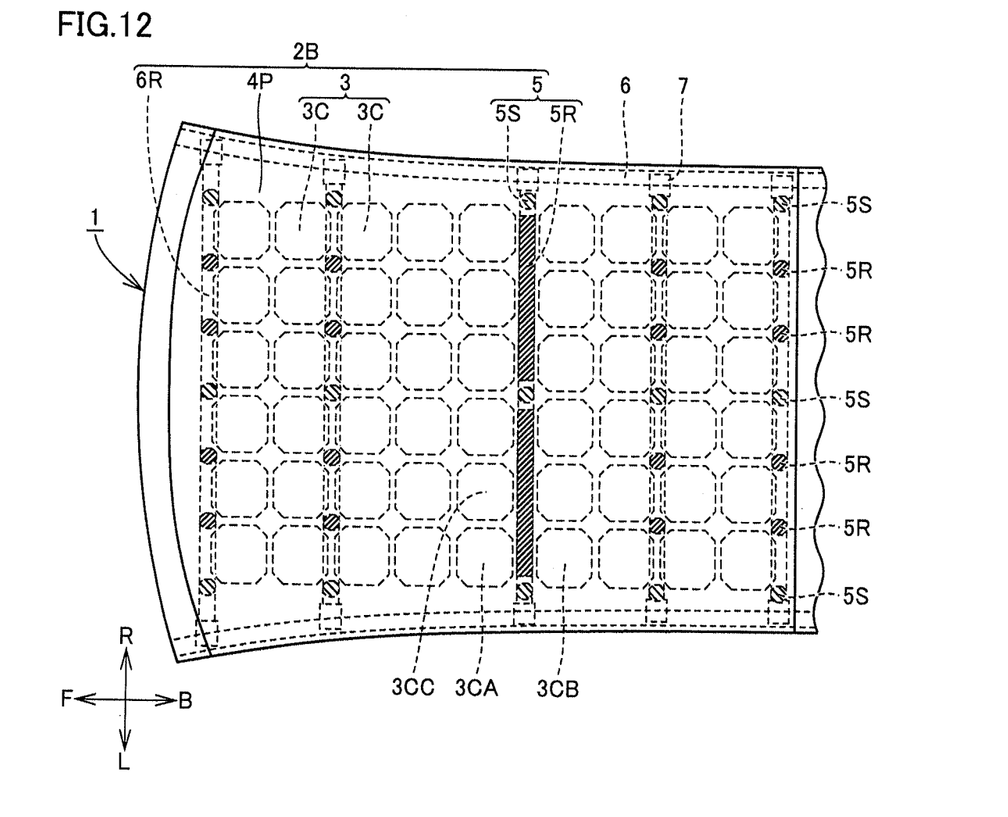
FIG. 12 is a plan view showing a vehicle roof structure according to a second variation of the embodiment.

As a vehicle roof structure 2B shown in FIG. 12, supporting parts may be provided at positions corresponding to the intervals between two of the plurality of solar cells 3C adjacent to each other. In FIG. 12, the cushion rubber 5R is provided between solar cells 3CA and 3CB adjacent to each other in the vehicle longitudinal direction. The cushion rubber 5R has a shape extending in the vehicle width direction. The supporting part 5 including the cushion rubber 5R and the positioning part 5S may be provided between the solar cell 3CA and a solar cell 3CC adjacent to each other in the vehicle width direction. With these structures, functions and effects similar to those described above can also be obtained.

[Other Variations]

In the above-described embodiment, the cushion rubber 5R (FIG. 6) as the supporting part and the positioning part 5S (FIG. 8) are employed. This structure is not a limitation, but the positioning part 5S may be configured to have both the positioning function and the supporting function as the supporting part, or the cushion rubber 5R (the supporting part) may have the function of the positioning part. Even in such a case, the effect can be obtained in which the solar cells can be prevented from breaking down under stress since the positioning part and the supporting part are provided utilizing the position corresponding to the intervals left between the plurality of solar cells. The cushion rubber, the positioning part and the raised part can be embodied in combination or alone.

The supporting part may be implemented by a member not having the cushioning function. Even in such a case, the effect can be obtained in which the solar cells can be prevented from breaking down under stress by providing the supporting part at the position corresponding to the intervals left between the plurality of solar cells.

In the above-described embodiment, the reinforcement 6R has the opening 4H. The opening 4H is not limited to the shape of through-hole, but may have a recessed shape. This structure is not a limitation, but an opening (recess) may be provided on the solar cell unit 3 (the transparent resin 3R) side, and the positioning part may be provided on the reinforcement 6R side. In other words, as long as the positioning function can be effected, one of the reinforcement 6R and the transparent resin 3R may be provided with an opening, and the positioning part 5S may be fixed to the other one of the reinforcement 6R and the transparent resin 3R. Even in these cases, the effect can be obtained in which the solar cells can be prevented from breaking down under stress by providing the supporting part at the position corresponding to the intervals left between the plurality of solar cells.

In the above-described embodiment, the reinforcements 6R having a shape extending in the form of rod are used as the reinforcing members. The reinforcing members are not limited to the rod-like members, but may be implemented by a plate-like member such as a flat plate or a curved plate. The plate-like member may have a size similar to that of the roof panel 4P, or may have a structure divided into a plurality of pieces.

In the above-described embodiment, the reinforcements 6R each have a rectangular tube-shaped (generally quadrilateral) cross section. The reinforcements 6R may have a cylindrical or a columnar cross section, or may have a C- or U-shaped cross section, or may have a hat-shaped cross section. The cross section of the reinforcement (reinforcing member) is preferably determined to assume a shape having the optimum moment of inertia of area depending on required rigidity.

The above-described reinforcements 6R are disposed to extend in the vehicle width direction. The reinforcements 6R may be disposed to extend in the vehicle longitudinal direction, or those extending in the vehicle width direction and those extending in the vehicle longitudinal direction may be combined together.

Although the embodiment of the present invention has been described, it should be understood that the embodiment disclosed herein is illustrative and non-restrictive in every respect. The scope of the present invention is defined by the claims, and is intended to include any modification within the meaning and scope equivalent to the terms of the claims.

What is claimed is:

1. A vehicle roof structure, comprising:
   a solar cell unit having a plurality of solar cells arranged in a planar form at intervals from one another and a sealing resin sealing said plurality of solar cells;
   a roof panel having transparency and disposed to cover said solar cell unit from above; and
   a reinforcing member disposed under said solar cell unit,
   said reinforcing member supporting said solar cell unit with a plurality of supporting parts provided at positions corresponding to the intervals left between said plurality of solar cells.

2. The vehicle roof structure according to claim 1, wherein said plurality of supporting parts include cushion rubbers provided separately from said solar cell unit, and said reinforcing member supports said solar cell unit with said cushion rubbers interposed therebetween.

3. The vehicle roof structure according to claim 1, wherein said plurality of supporting parts each include a raised part formed integrally with said solar cell unit and formed such that part of said sealing resin is raised toward said reinforcing member, and
said reinforcing member supports said solar cell unit with said raised part interposed therebetween.

4. The vehicle roof structure according to claim 3, wherein said roof panel includes a projecting part formed integrally with said roof panel at a position corresponding to said intervals left between said plurality of solar cells, and
said raised part is formed by providing said projecting part for said roof panel.

5. The vehicle roof structure according to claim 1, wherein said solar cell unit includes a positioning part at a position corresponding to the intervals left between said plurality of solar cells, and
said reinforcing member is positioned at said solar cell unit with said positioning part.

6. The vehicle roof structure according to claim 5, wherein said reinforcing member has an opening, and
said positioning part has a projection being fixed to said roof panel and extending in a rod-like form from said sealing resin toward said reinforcing member.

7. The vehicle roof structure according to claim 1, wherein said plurality of solar cells are arranged in a matrix form, and
said plurality of supporting parts include said supporting parts provided at positions corresponding to said intervals left between four of said plurality of solar cells arranged in two rows and two columns.

8. The vehicle roof structure according to claim 1, wherein said plurality of supporting parts include said supporting parts provided at positions corresponding to said intervals left between two of said plurality of solar cells adjacent to each other.

9. The vehicle roof structure according to claim 1, wherein said reinforcing member includes a plurality of reinforcements each being implemented by a metallic member and disposed to extend in a vehicle longitudinal direction and/or a vehicle width direction.

10. The vehicle roof structure according to claim 1, wherein said roof panel is made of resin.

* * * * *